(12) United States Patent
Ryoo

(10) Patent No.: US 8,054,112 B2
(45) Date of Patent: Nov. 8, 2011

(54) RESET CONTROL METHOD AND APPARATUS IN POWER MANAGEMENT INTEGRATED CIRCUIT

(75) Inventor: Ji-Yeoul Ryoo, Hweseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 166 days.

(21) Appl. No.: 12/149,323

(22) Filed: Apr. 30, 2008

(65) Prior Publication Data

US 2009/0002037 A1 Jan. 1, 2009

(30) Foreign Application Priority Data

Jun. 29, 2007 (KR) ........................ 10-2007-0065108

(51) Int. Cl.
*H03L 7/00* (2006.01)

(52) U.S. Cl. ...................................... 327/143

(58) Field of Classification Search ............... 327/143, 327/538

See application file for complete search history.

(56) References Cited

U.S. PATENT DOCUMENTS

| | | | |
|---|---|---|---|
| 5,917,255 A | 6/1999 | Ciccone | |
| 5,936,443 A | 8/1999 | Yasuda et al. | |
| 6,272,025 B1 * | 8/2001 | Riggio et al. | 363/24 |
| 6,633,187 B1 | 10/2003 | May et al. | |
| 6,861,895 B1 * | 3/2005 | Liu et al. | 327/536 |
| 7,176,750 B2 * | 2/2007 | Oddone et al. | 327/539 |
| 7,606,099 B2 * | 10/2009 | Chung | 365/211 |

* cited by examiner

*Primary Examiner* — Lincoln Donovan
*Assistant Examiner* — Daniel Rojas
(74) *Attorney, Agent, or Firm* — Lee & Morse, P.C.

(57) ABSTRACT

A reset control apparatus may include a first reference generator adapted to output a first reference value in response to an enable signal from an external power source, a second reference generator adapted to receive the first reference value and to output a second reference value, and a set signal generator adapted to output a set signal when the second reference value exceeds a predetermined value.

15 Claims, 12 Drawing Sheets

RESET CONTROL METHOD AND APPARATUS IN POWER MANAGEMENT INTEGRATED CIRCUIT

BACKGROUND

1. Field of the Invention

Embodiments are directed to a reset control method and apparatus. More particularly, embodiments are directed to a reset control method and apparatus in a power management integrated circuit.

2. Description of the Related Art

Proper enablement of functional circuit blocks includes delaying operation of these blocks until the output of the power supply is stable. Ensuring proper enablement of functional circuit blocks on an integrated circuit (IC) is relatively simple when a regulated power supply is external to the IC. When a power converter is on the IC, however, proper enablement is more difficult to ensure, especially during power transition periods.

Power management circuits (PMCs) may be used to prevent functional circuit blocks from malfunctioning during an initial transition period, e.g., rising or falling period. In particular, during the transition period, the output voltage that the PMC is configured to control may be lower than a desired voltage. Functional circuit blocks that use the output voltage as a voltage source may malfunction due to the low voltage and/or a variation in voltage. To avoid these potential problems, the functional circuit blocks may be placed in a reset state during the transition period.

There are numerous advantages to using PMCs, including simpler dynamics, simpler robust output voltage control, and mitigation of transformer saturation problems. However, power supplied using PMCs may be more susceptible to noise than externally supplied power.

SUMMARY

Embodiments are therefore directed to a reset control method and apparatus, which overcome one or more of the problems associated with the related art.

It is a feature of an embodiment to provide a reset control method and apparatus that properly enables functional circuits.

It is another feature of an embodiment to provide a reset control method and apparatus having reduced noise in the supply of power.

At least one of the above and other features and advantages may be realized by providing a device including a first reference generator adapted to output a first reference value in response to an enable signal from an external power source, a second reference generator adapted to receive the first reference value and to output a second reference value, and a set signal generator adapted to output a set signal when the second reference value exceeds a predetermined value.

The device may include a switch between the first and second reference generators and a start-up trigger adapted to receive the enable signal and output a start-up signal to the switch after a predetermined period of time. The start-up trigger may be connected to the first reference generator.

The device may include a power converter adapted to receive the start-up signal and to output a power in accordance with the first reference value. The first reference generator may be integral with the power converter. The device may include a first comparator adapted to output a difference between a magnitude of the power output by the power converter and the second reference value, and a second comparator adapted to compare the difference and the predetermined reference value, wherein the set signal generator is further adapted to output the set signal when the difference is less than another predetermined reference value.

At least one of the above and other features and advantages may be realized by providing a system including a functional circuit, and a power management circuit adapted to supply power to the functional circuit, the power management circuit including a first reference generator adapted to output a first reference value in response to an enable signal from an external power source, a second reference generator adapted to receive the first reference value and to output a second reference value, and a set signal generator adapted to output a set signal to the functional circuit when the second reference value exceeds a predetermined value.

The functional circuit and the power management circuit may be stand alone integrated circuits or may form a system on chip.

At least one of the above and other features and advantages may be realized by providing a method for generating a set signal, including generating a first reference signal in response to an enable signal from an external power source, generating a second reference signal in response to the first reference signal, and outputting the set signal when the second reference signal exceeds a predetermined reference value.

Generating the second reference signal may occur after a predetermined period of time.

The method may include outputting a power in accordance with the first reference signal after the predetermined period of time.

The may include determining a difference between a magnitude of the power and the second reference signal, and comparing the difference and the predetermined reference value, wherein outputting the set signal further includes outputting the set signal when the difference is less than the predetermined reference value.

At least one of the above and other features and advantages may be realized by providing an article of manufacture having a machine accessible medium including data that, when accessed by a machine, cause the machine to perform a method for generating a set signal, the method including receiving an enable signal from an external power source, generating a first reference signal in response to the external enable signal, generating a second reference signal in response to the first reference signal, and outputting the set signal when the second reference signal exceeds a predetermined reference value.

At least one of the above and other features and advantages may be realized by providing an integrated circuit, including a power converter, a processing unit, and a memory unit operably coupled to the processing unit, the memory including operational instructions causing the processing unit to generate a first reference signal in response to an enable signal from an external power source, generate a second reference signal in response to the first reference signal, and when the second reference signal exceeds a predetermined value, allow the power converter to supply power from the external power source.

The integrated circuit may include a functional circuit adapted to receive power from the power converter. The power from the power converter may be supplied to an external functional circuit.

At least one of the above and other features and advantages may be realized by providing an integrated circuit, including a first reference generator adapted to output a first reference value in response to an enable signal from an external power source, a second reference generator adapted to receive the first reference value and to output a second reference value, a set signal generator adapted to output a set signal when the second reference value exceeds a predetermined value, a power switch adapted to generate a supply from the external power source, and a synchronizing signal generator adapted to output a synchronizing signal to the power switch and the second reference generator.

At least one of the above and other features and advantages may be realized by providing an integrated circuit, including a power converter adapted to generate a supply in response to an enable signal from an external power source, a timer adapted to output a periodic signal in response to the enable signal, and a set signal generator adapted to output a set signal in response to the periodic signal.

The integrated circuit may include a functional circuit adapted to receive the supply and the set signal.

At least one of the above and other features and advantages may be realized by providing an integrated circuit, including a power converter adapted to generate a supply in response to an enable signal from an external power source, and a simulator adapted to simulate a stabilization period of the power converter.

BRIEF DESCRIPTION OF THE DRAWINGS

The above and other features and advantages will become more apparent to those of ordinary skill in the art by describing in detail example embodiments thereof with reference to the attached drawings, in which.

DETAILED DESCRIPTION

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

Unless otherwise defined, all terms used herein, including technical and scientific terms, have the same meaning as commonly understood by one of ordinary skill in the art. It will be further understood that terms such as those defined in commonly used dictionaries should be interpreted as having a meaning that is consistent with their meaning in the context of the relevant art, and not in an idealized or overly formal sense unless expressly so defined herein.

As will be discussed in detail below, embodiments may use a reference voltage for power management and proper enablement of one or more functional circuitry units. The functional circuitry unit may be any type of circuit, system or component, e.g., a digital signal processor, an encoder, a decoder, a microprocessor, a memory, and so forth.

Figure 1:
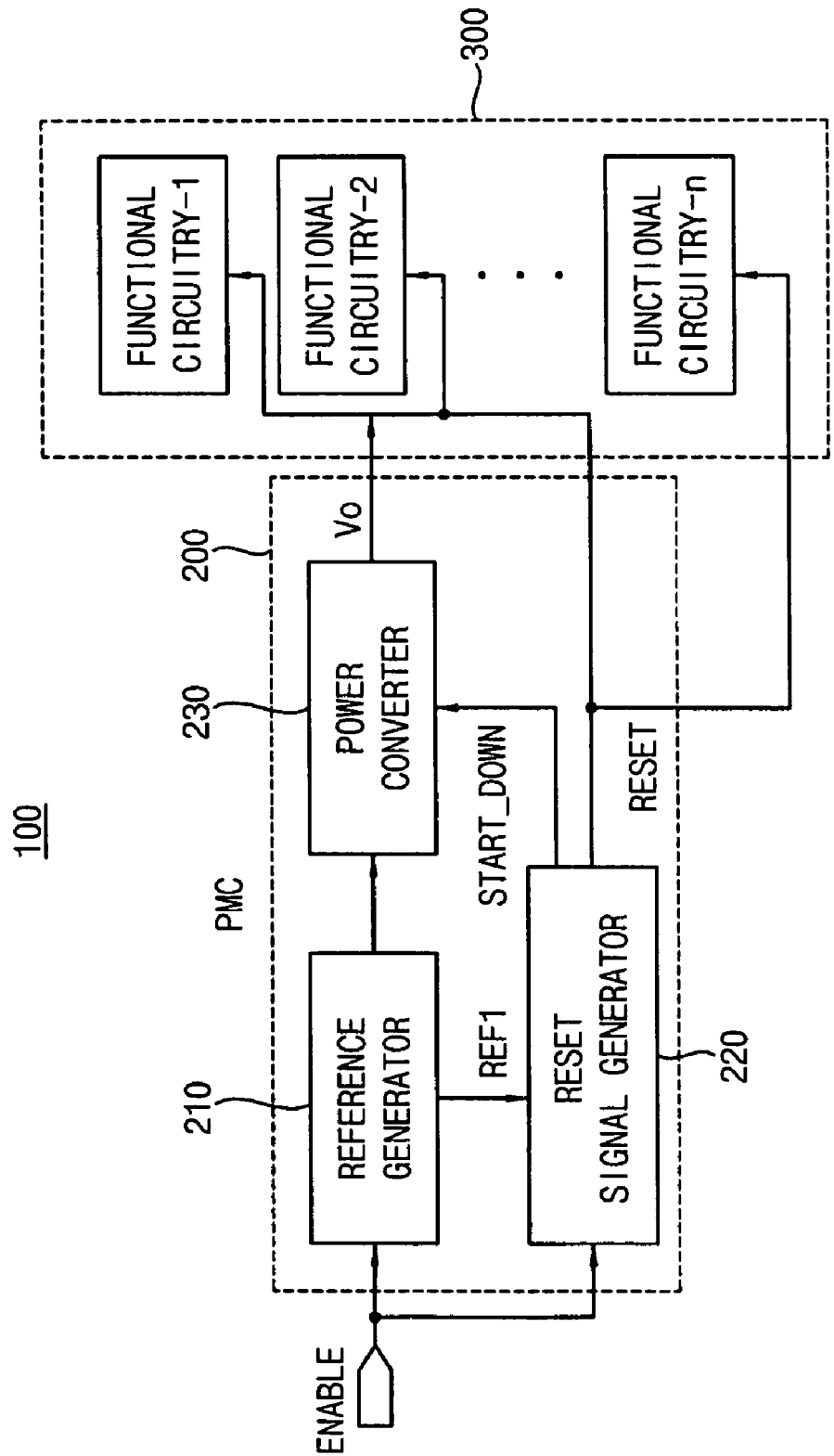
FIG. 1 illustrates a schematic block diagram of a PMC implemented as a stand-alone IC in accordance with an embodiment.

As illustrated in FIG. 1, a stand-alone IC 100 may include a PMC 200 and a functional circuit 300. The functional circuit 300 may include a plurality of functional circuitry units 1, ..., n that may perform any desired function. The PMC 200 may include a reference generator 210, a reset signal generator 220 and an on-chip power converter 230.

The reference generator 210 may be, e.g., a band-gap reference (BGR) circuit, and may be separate from or integral with the power converter 230. The power converter 230 may generate a supply, e.g., a voltage or a current, from an external power source (not shown). In FIG. 1, this supply is indicated as an output voltage Vo.

In general, the reset signal generator 220 may detect a first reference voltage REF1 output by the reference generator 210. The reset signal generator 220 may reset the functional circuit 300 when the first reference voltage REF1 is in a transition period and may set the functional circuit 300 when the first reference voltage REF1 reaches a steady state.

Figure 2:
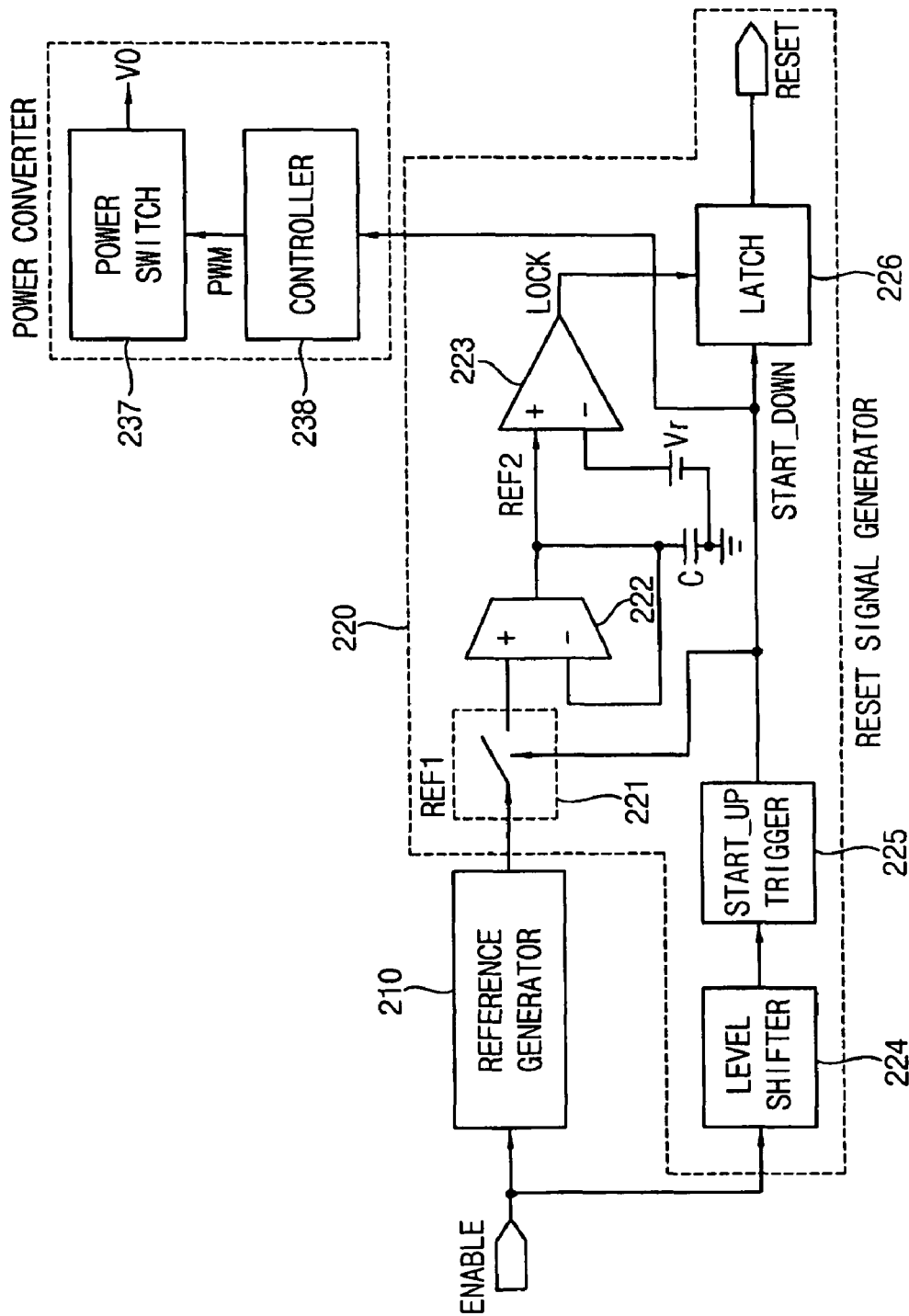
FIG. 2 illustrates a detailed block diagram of the PMC of FIG. 1 in accordance with an embodiment.

A more detailed block diagram of the reset signal generator 220 and the power converter 230 of the stand-alone IC 100 in accordance with an embodiment is illustrated in FIG. 2. As illustrated therein, the reset signal generator 220 may include a selector 221, an amplifier 222, a comparator 223, a level shifter 224, a start_up trigger 225 and a latch 226. The power converter 230 may include a power switch 237 and a controller 238.

Figure 3:
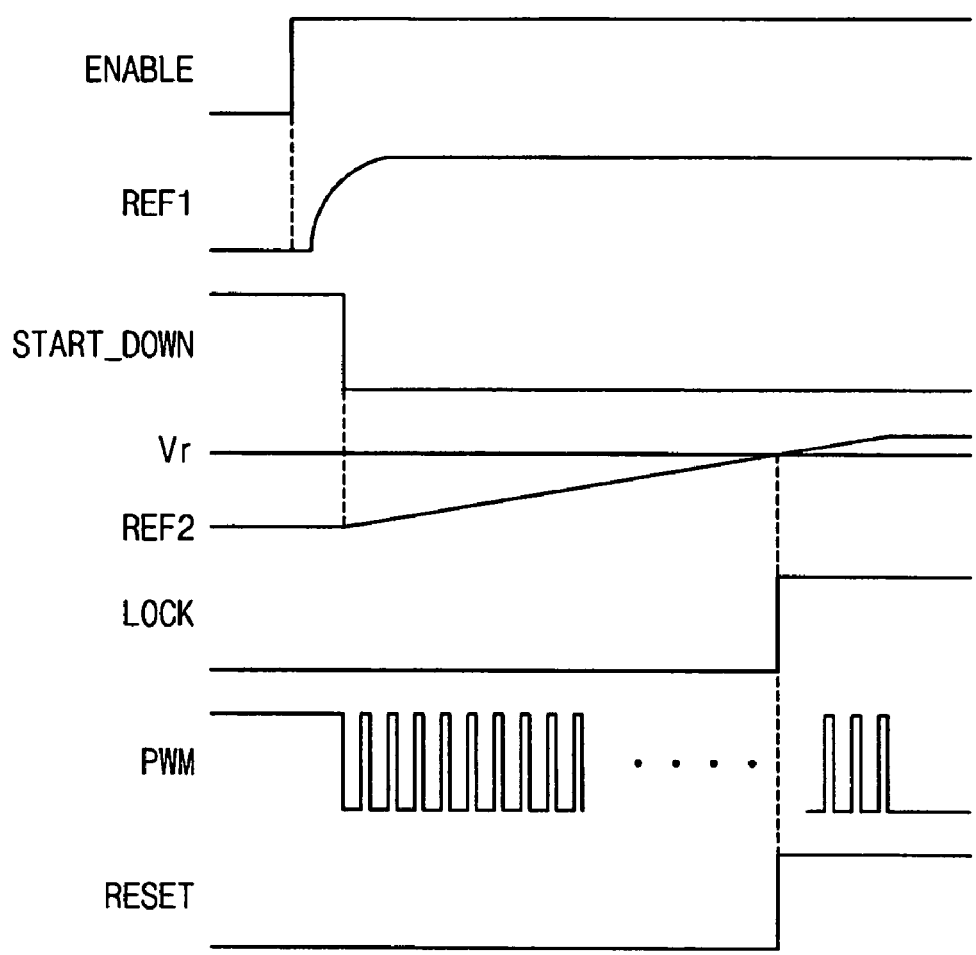
FIG. 3 illustrates a timing diagram of the PMC of FIG. 2.

The operation of the reset signal generator 220 and the power converter 230 illustrated in FIG. 2 is discussed in detail with reference to the timing diagrams of FIG. 3. When Enable is low, even if external power is supplied, the functional circuit 300 does not operate, as it is in a reset state. When Enable is high, the reference generator 210 may output the first reference voltage REF1 and the start_up trigger 225 may generate a Start_Down signal that goes from high to low after a delay provided by the level shifter 224.

When the Start_Down signal output by the start_up trigger 225 becomes low, the selector 221 may output the first reference voltage REF1 to the amplifier 222 and the controller 238 may output a pulse width modulated (PWM) signal. The PWM signal may control the power switch 237 to generate the output voltage Vo.

After receiving the first reference voltage REF1, the amplifier 222 may slowly ramp up a second reference voltage REF2 and may charge a capacitor C to a detected reference voltage Vr derived from the first reference voltage REF1. The comparator 223 may compare the second reference voltage REF2 output by the amplifier 222 with the detected reference voltage Vr.

When the second reference voltage REF2 reaches the detected reference voltage Vr, the comparator 223 may output a Lock signal to the latch 226, which may also receive the Start_Down signal from the start_up trigger 225. When the latch 226 receives a high Lock signal and a low Start_Down signal, the latch 226 may cancel RESET, i.e., allow functional circuitry 300 to operate. Once the Lock signal becomes low and the Start_Down signal becomes high, the latch 226 may output the RESET signal to stop operation of the functional circuit 300.

Figure 4:
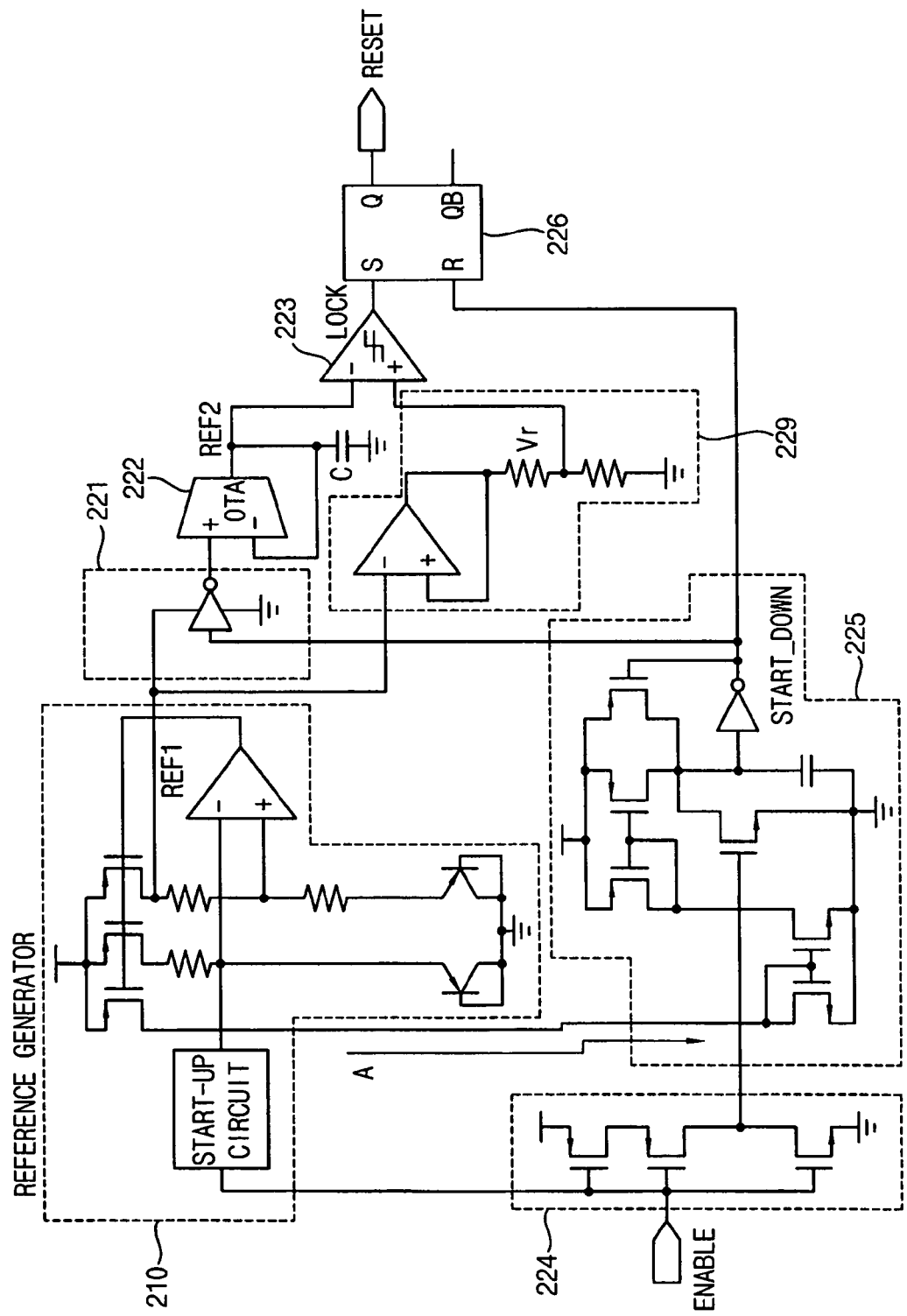
FIG. 4 illustrates a circuit diagram of the PMC of FIG. 2 in accordance with an embodiment.

An exemplary embodiment of a detailed circuit diagram of the reference generator 210 and the reset signal generator 220 is illustrated in FIG. 4. The level shifter 224 may include a plurality of transistors connected in series that slowly transition from low to high when the Enable signal is low. The output of the level shifter 224 may be provided to the start_up trigger 225. Current for the start_up trigger 225 may be provided from the reference generator 210. In turn, when the Enable signal is supplied to a start-up circuit in the reference generator 210, the start-up circuit generates a trigger current, turning on the reference generator 210. After the reference generator 210 is operational, the start-up circuit may be disabled.

The reference generator 210 may include three transistors connected in parallel. These transistors may form a current mirror such that the current in all three paths is substantially equal. As noted above, a first current path A may provide current to the start_up trigger 225. The other two current paths may be connected to ground through resistor(s) and a diode connected bipolar transistor. The reference generator 210 may also include an operational amplifier that receives voltages from nodes in these other two current paths, i.e., a node between at least one resistor and the bipolar transistor in a path. An output of the operational amplifier may be fed back to the current mirror, forming a closed loop. The first reference voltage REF1 output from the reference generator 210 may be substantially temperature independent. The first reference voltage REF1 may then be output from the reference generator 210 to the selector 221, here a switching diode, and to a detection voltage generator 229.

The start_up trigger 225 may include a plurality of transistors, a capacitor and a switching diode. The capacitor may be discharged to zero when the Enable signal is high. The capacitor may be charged by the current from the reference generator 210. Once a sufficient voltage is applied to the switching diode in the start_up trigger 225, a low Start_Down signal may be output to the selector 221 and the latch 226.

When the Start_down signal from the start_up trigger 225 is low, the selector 221 may output the first reference voltage REF1 to the amplifier 222. As illustrated in FIG. 4, the amplifier 222 may be an operational transconductance amplifier (OTA). The OTA 222 has very high impedance compared with a typical operational amplifier. The OTA 222 may output the second reference voltage REF2 in response to the first reference voltage REF1 and a fed back signal from the output of the OTA. A capacitor C at the output stage of the OTA 222 may be slowly charged as the second reference voltage REF2 slowly ramps up. The second reference voltage REF2 may also be output to the comparator 223.

The detected reference voltage Vr may be generated from the first reference voltage REF1 using a closed loop operational amplifier. As can be seen in FIG. 3, the detected reference voltage Vr may reach steady state very quickly, as compared with the second reference voltage REF2. The detected reference voltage Vr may be output to the comparator 223.

When the second reference voltage REF2 exceeds the detected reference voltage Vr, the comparator 223 may output the Lock signal to the latch 226. As shown herein, the latch 226 may be a simple SR latch, receiving the Lock signal at the S input and the Start_Down signal at the R input.

Figure 5:
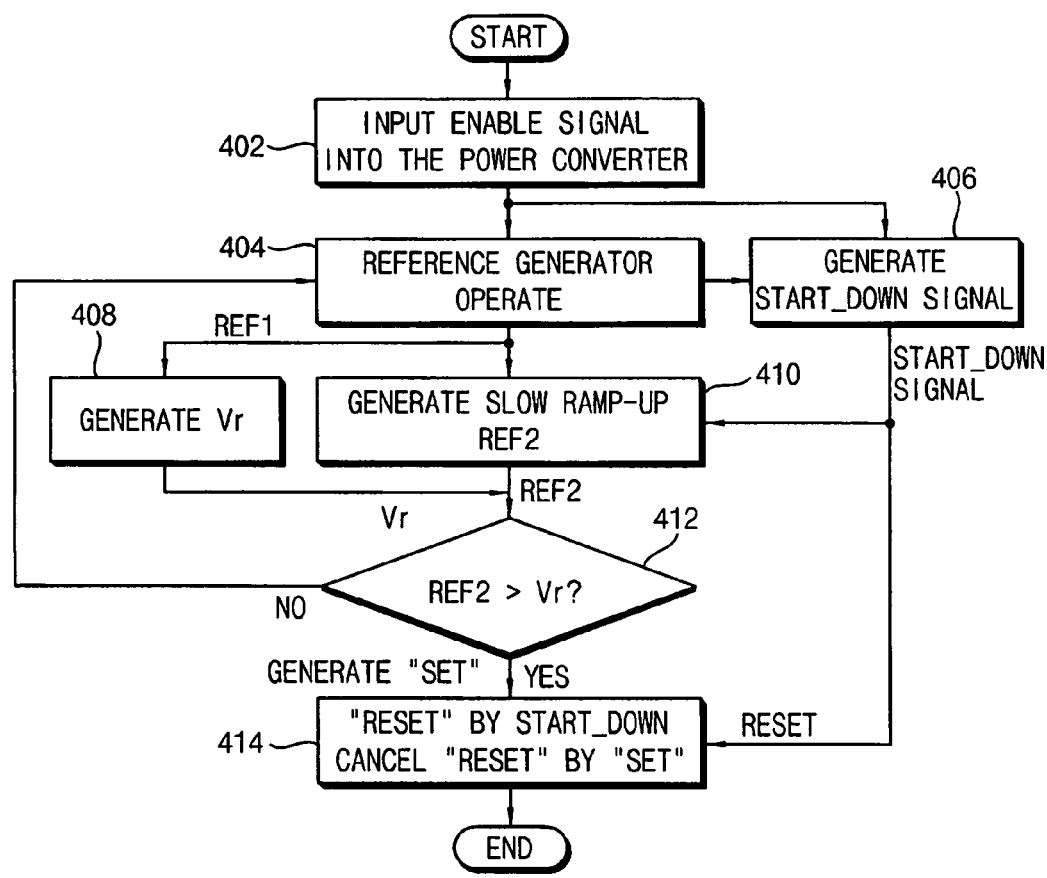
FIG. 5 illustrates a flow chart of the PMC of FIG. 4 in accordance with an embodiment.

FIG. 5 illustrates a flowchart of the operation of the PMC 200 in accordance with an embodiment. In 402, the Enable signal is received by the PMC 200. In 404, the reference generator operates in response to the Enable signal, and outputs a current and the first reference voltage REF1 after a delay, e.g., about 25 microseconds. In 406, the Start_down signal is generated in response to the Enable signal and the current. In 408, the detected reference voltage Vr is generated in response to the first reference voltage REF1. In 410, the second reference voltage REF2 is generated using a slow ramp-up in response to the first reference voltage REF1 once the Start_Down signal has been received from 406.

In 412, the second reference voltage REF2 is compared to the detected reference voltage Vr. When the second reference voltage REF2 does not exceed the detected reference voltage Vr, the operation may return to 404 to continue ramping up the second reference voltage REF2. When the second reference voltage REF2 exceeds the detected reference voltage Vr, a set signal may be generated and the operation may proceed to 414 to cancel the reset in response the set signal and the Start_Down signal. The entire operation may take about 1 millisecond.

Figure 6:
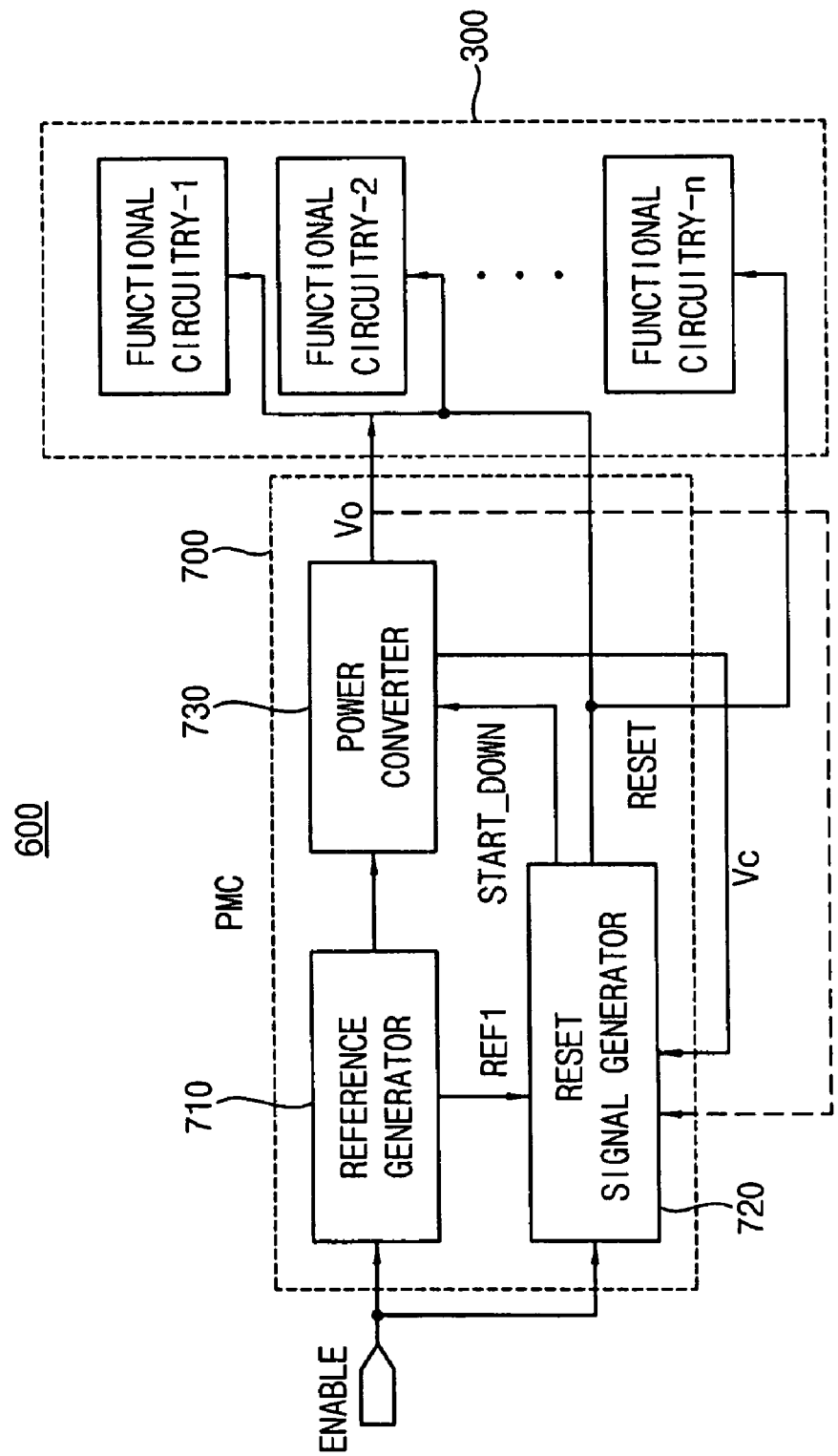
FIG. 6 illustrates a schematic block diagram of a PMC implemented as a stand-alone IC in accordance with an embodiment.

FIG. 6 illustrates a schematic block diagram of a PMC implemented as a stand-alone IC in accordance with an embodiment. As illustrated in FIG. 6, a stand-alone IC 600 may include a PMC 700 and the functional circuit 300. The PMC 700 may include a reference generator 710, a reset signal generator 720 and an on-chip power converter 730. The reference generator 710 may be, e.g., a band-gap reference (BGR) circuit, and may be separate from or integral with the power converter 730.

In this embodiment, a control voltage Vc representing a difference between the output voltage Vo and the second reference voltage VREF2 may also be used to control the reset of the functional circuit 300. The control voltage Vc may be determined by the power converter 730 and then output to the reset signal generator 720, as indicated by the solid line in FIG. 6. Alternatively, the reset signal generator 720 may receive the output voltage Vo from the power converter 730 and generate the control voltage Vc internally, as indicated by the dashed line in FIG. 6.

Figure 7:
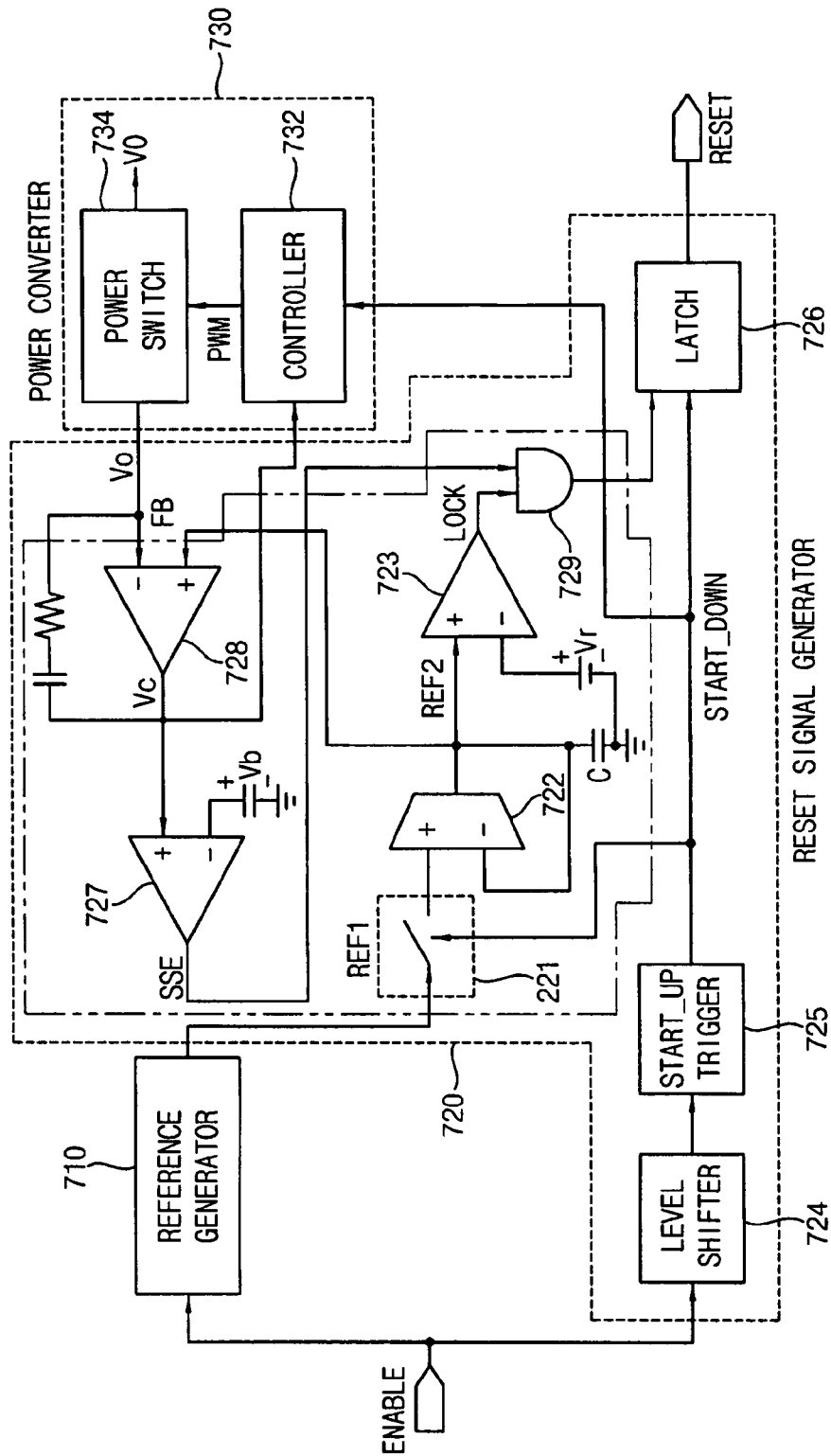
FIG. 7 illustrates a detailed block diagram of the PMC of FIG. 6 in accordance with an embodiment.

A more detailed block diagram of the reset signal generator 720 and the power converter 730 of the stand-alone IC 700 is illustrated in FIG. 7. As illustrated therein, the reset signal generator 720 may include a selector 721, an amplifier 722, a first comparator 723, a level shifter 724, a start_up trigger 725, a latch 726, a second comparator 727, a third comparator 728 and a logic gate 729, here an AND gate. The power converter 730 may include a power switch 732 and a controller 734.

Figure 8:
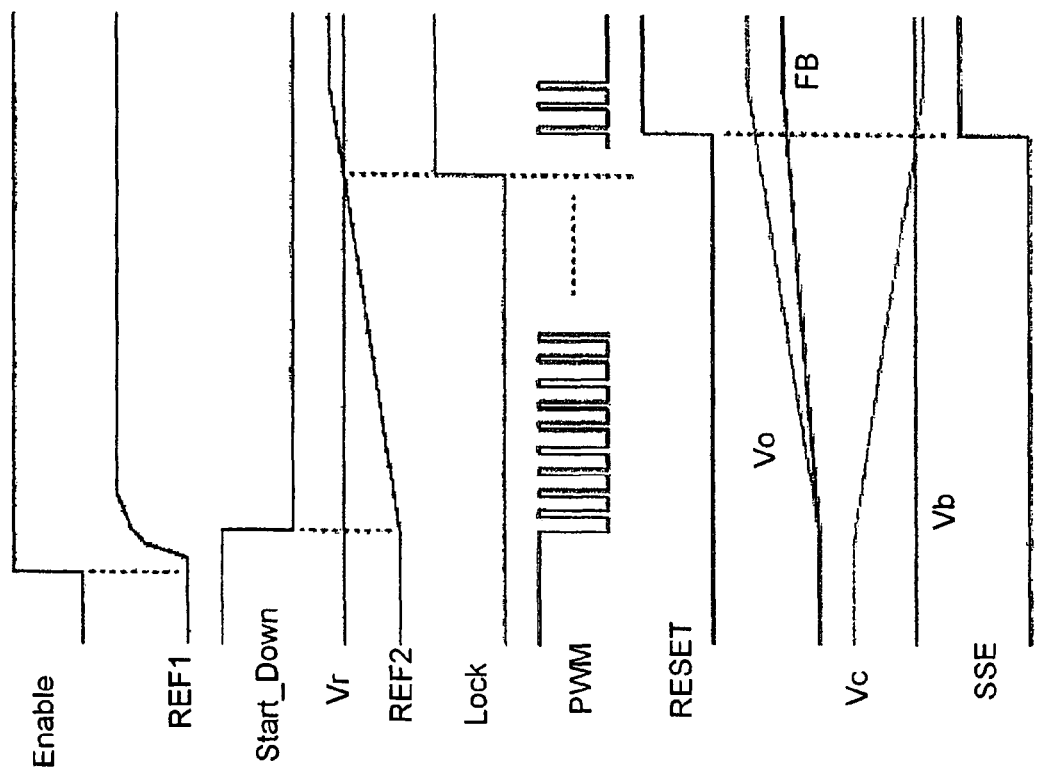
FIG. 8 illustrates a timing diagram of the PMC of FIG. 7.

The operation of the block diagram illustrated in FIG. 7 is discussed in detail with reference to the timing diagrams of FIG. 8. When Enable is low, even if external power is supplied, the functional circuits 300 do not operate. When Enable is high, the reference generator 710 may output the first reference voltage REF1 and the start_up trigger 725 generates a Start_Down signal that goes from high to low after a delay provided by the level shifter 724.

When the Start_down signal output by the start_up trigger 725 becomes low, the selector 721 may output the first reference voltage REF1 to the amplifier 722 and the controller 732 may start PWM operation. The controller 732 may receive the first reference voltage REF1 from the reference generator 710. The PWM signal output from the controller 732 may control the power switch 734 to generate the output voltage Vo.

After receiving the first reference voltage REF1, the amplifier 722, e.g., an OTA, may slowly ramp up the second reference voltage REF2 and may charge a capacitor C to the detected reference voltage Vr derived from the first reference voltage REF1. The comparator 723 may compare the second reference voltage REF2 output by the amplifier 722 with the detected reference voltage Vr. When the second reference voltage REF2 reaches the detected reference voltage Vr, the comparator 723 may output a Lock signal to the AND gate 729. Thus, the Lock signal may be generated as in the previous embodiment.

The third comparator 728 may compare the second reference voltage REF2 to a feedback voltage FB output from the power switch 734, and may output the control voltage Vc to the second comparator 727 and the controller 732. The second comparator 727 may compare the control voltage Vc to a detected reference voltage Vb derived from the first reference voltage REF1. The second comparator 727 outputs a Soft_Start End (SSE) signal as a result of the comparison. When Vc>Vb, the SSE signal is low, and when Vb>Vc, the SSE signal is high.

The SSE signal may be output to the AND gate 729. When both the SSE signal and the Lock signal are high, the AND gate 729 outputs a high signal to the latch 726. The latch 726 may also receives the Start_Down signal from the start_up trigger 725. When the latch 726 receives a high signal from the AND gate 729 and a low Start_Down signal, the latch 726 may cancel RESET, i.e., allow the functional circuit 300 to operate. Once the signal output by the AND gate 729 becomes low or the Start_Down signal becomes high, the latch 726 may output the RESET signal to stop operation of the functional circuitry 300.

Thus, the PMC 700 in accordance with an embodiment may set the functional circuitry 300 when both the second reference voltage REF2 exceeds the detected reference voltage Vr and the control voltage Vc is less than the detected reference voltage Vb. Thus, feedback from the power converter 730 to the reset signal generator 720 may be implemented, further ensuring proper enablement of the functional circuit 300.

Figure 9:
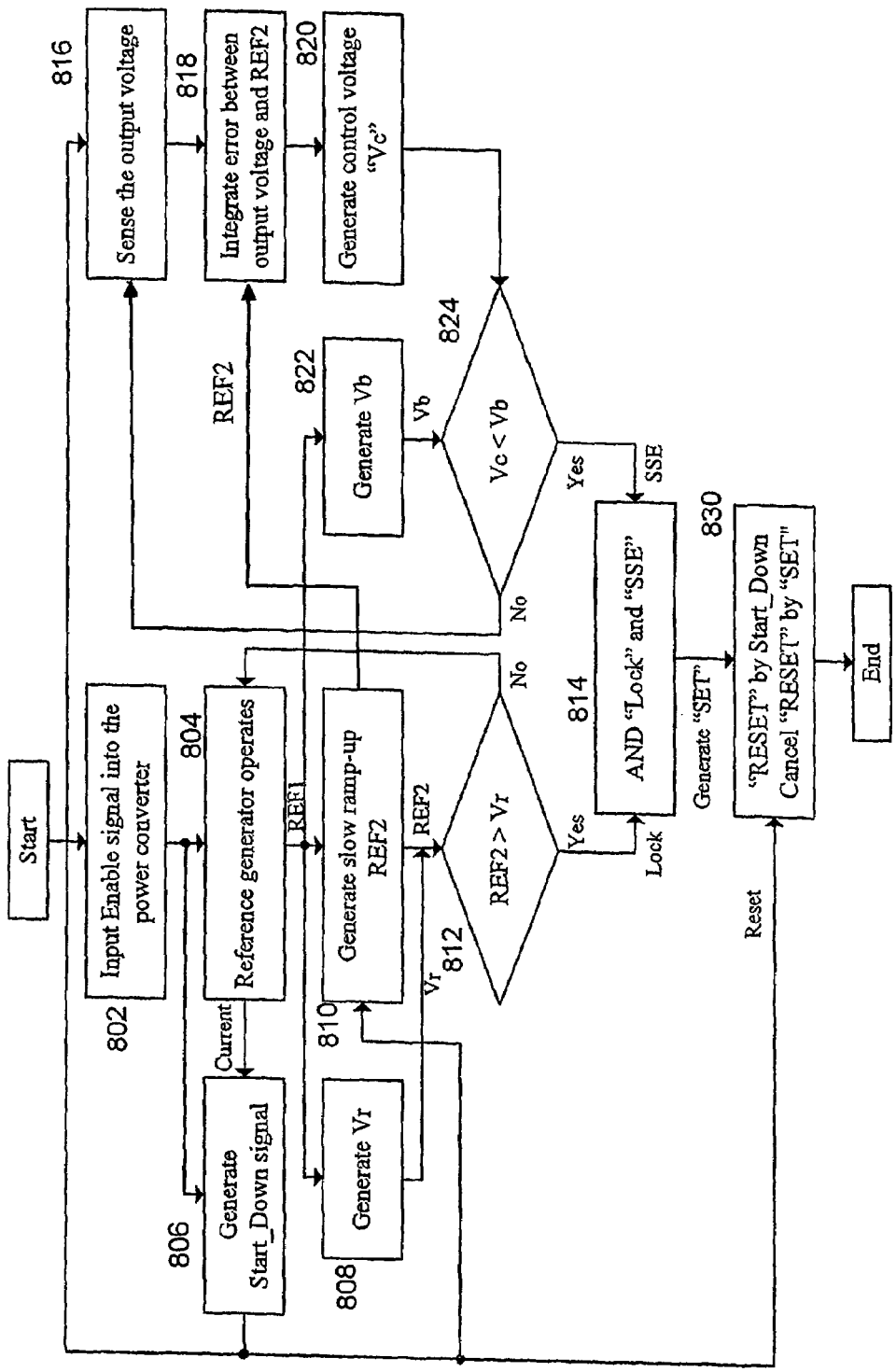
FIG. 9 illustrates a flow chart of the PMC of FIG. 7 in accordance with an embodiment.

FIG. 9 illustrates a flowchart of the operation of the PMC 700 in accordance with an embodiment. In 802, the Enable signal is received by the PMC 700. In 804, the reference generator may operate in response to the Enable signal, and may output a current and the first reference voltage REF1 after a delay, e.g., of about 25 microseconds. In 806, the Start_down signal is generated in response to the Enable signal and the current. In 808, the detected reference voltage Vr is generated in response to the first reference voltage REF1. In 810, the second reference voltage REF2 is generated using a slow ramp-up in response to the first reference voltage REF1 once the Start_down signal has been received from 806.

In 812, the second reference voltage REF2 is compared to the detected reference voltage Vr. When the second reference voltage REF2 does not exceed the detected reference voltage Vr, the operation may return to 804 to continue ramping up the second reference voltage REF2. When the second reference voltage REF2 exceeds the detected reference voltage Vr, the Lock signal may be output as high and the operation may proceed to 814.

In parallel, in 816, the output voltage Vo is sensed. In 818, error between the output voltage Vo via the feedback signal FB and the second reference voltage REF2 may be output to 820, which, in turn, generates the control voltage Vc. In 822, the detected reference voltage Vb is generated from the first reference voltage REF1. In 824, the control voltage Vc is compared to the detected reference voltage Vb. When the control voltage Vc exceeds the detected reference voltage Vb, the operation may return 816 to sense the output voltage Vo again. When the control voltage Vc is less than the detected reference voltage Vb, the SSE signal may be output as high and operation may proceed to 814.

In 814, the Lock signal and the SSE signal are logically ANDed. When both the Lock signal and the SSE signal are high, a set signal may be generated, and the operation may proceed to 830 to cancel the reset in response the set signal and the Start_Down signal. The entire operation may take about 1 millisecond.

Figure 10:
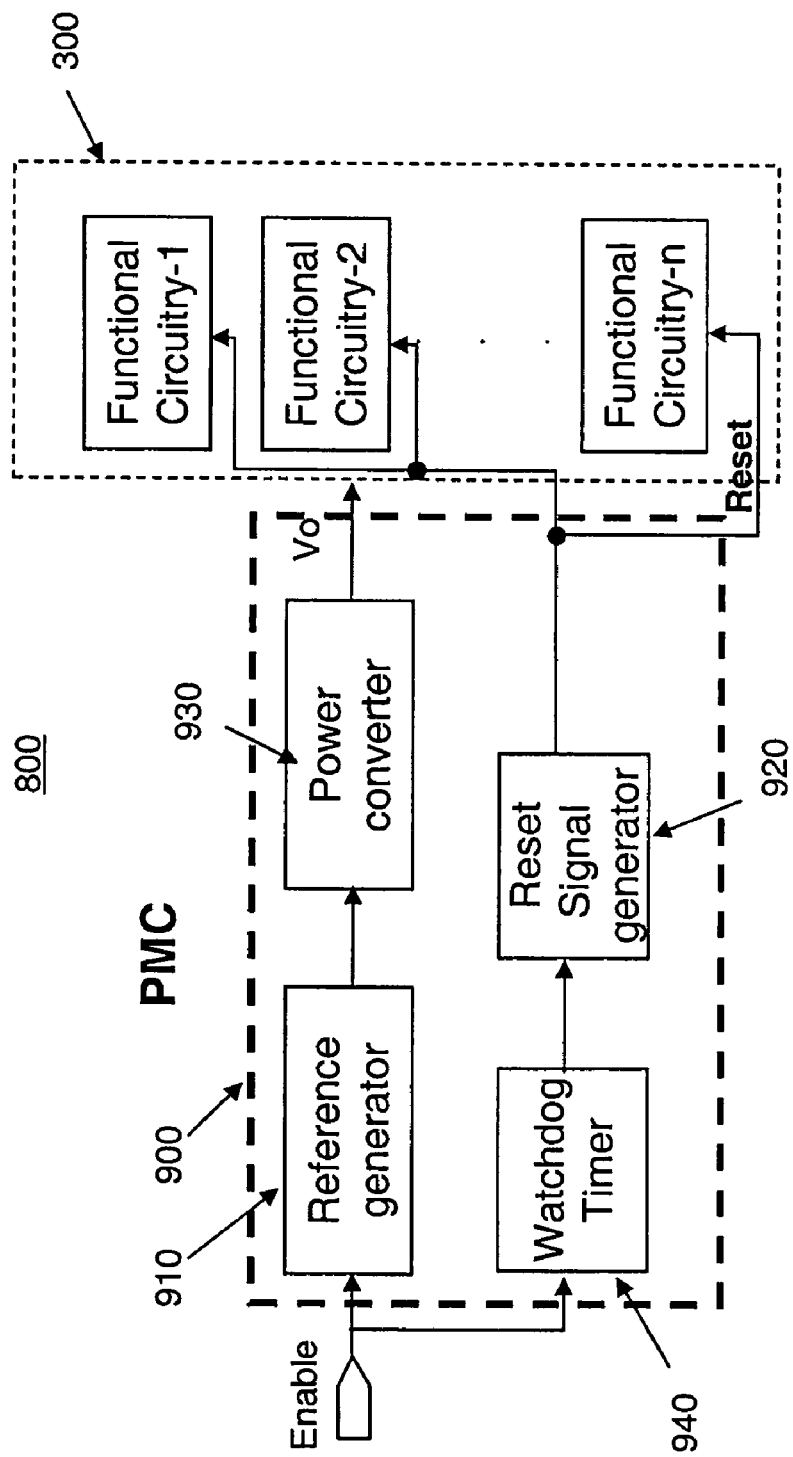
FIG. 10 illustrates a schematic block diagram of a PMC implemented as a stand-alone IC in accordance with an embodiment.

FIG. 10 illustrates a schematic block diagram of a PMC implemented as a stand-alone IC in accordance with an embodiment. As illustrated in FIG. 10, a stand-alone IC 800 may include a PMC 900 and the functional circuit 300. The PMC 900 may include a reference generator 910, a reset signal generator 920, an on-chip power converter 930, and a watchdog timer 940. The reference generator 910 may be, e.g., a band-gap reference (BGR) circuit, and may be separate from or integral with the power converter 930.

The PMC 900 of this embodiment may operate assuming that output voltage Vo is stable after a predetermined time. The watchdog timer 940 may output regular signals periodically to the reset generator 920. The reset generator 920 may, in response, periodically output Reset and Set signals.

Figure 11:
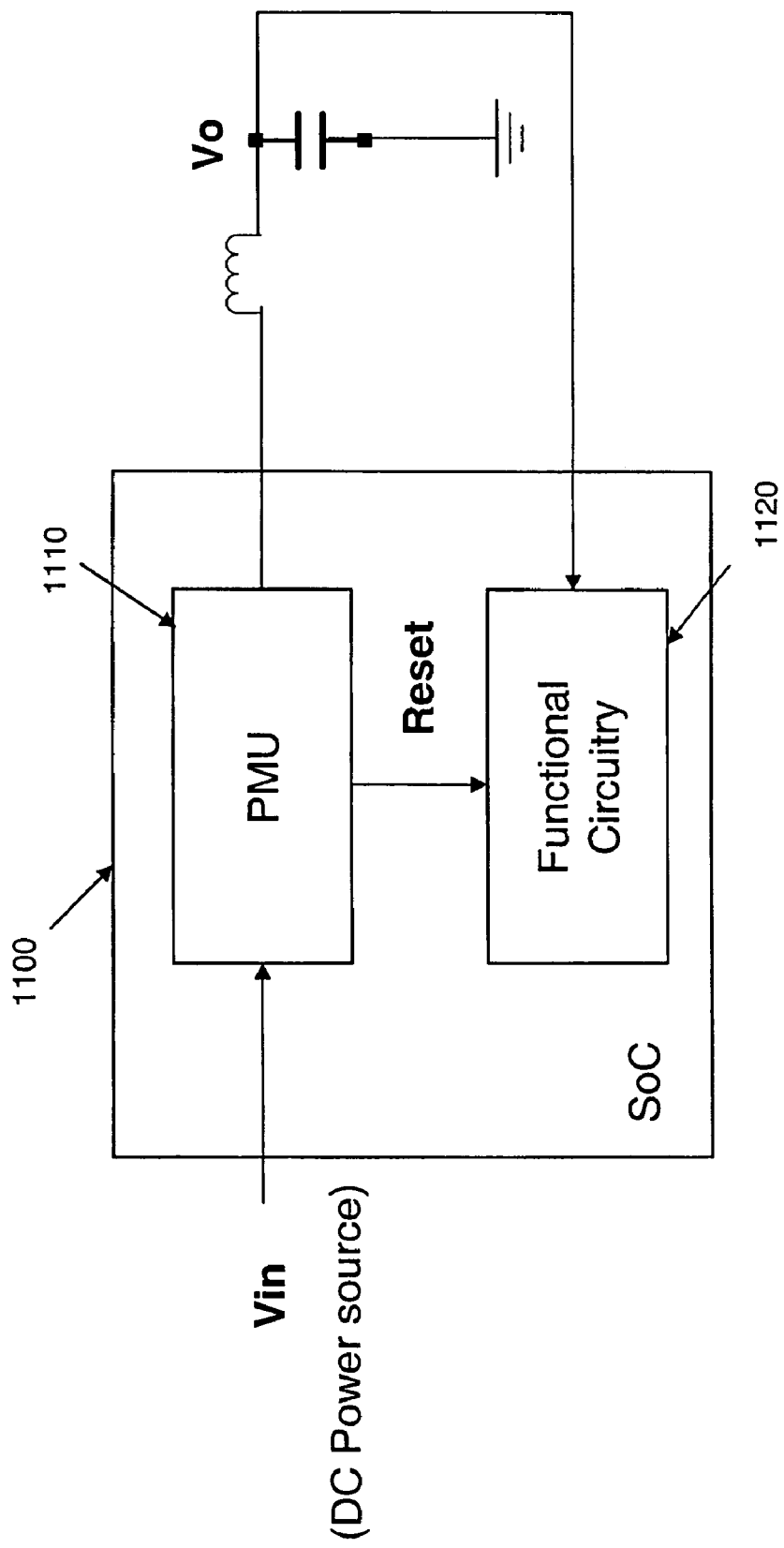
FIG. 11 illustrates a first application block diagram in accordance with an embodiment.

FIG. 11 illustrates a block diagram of an application of a power management unit (PMU), having a PMC, e.g., 200, 700, 900, in accordance with an embodiment. A SoC 1100 may include a PMU 1110 and functional circuitry 1120. The PMU 1110 may be adapted to convert power from a power source Vin to the output voltage Vo and supply the output voltage Vo to the functional circuitry 1120. The PMU 1110 may also be adapted to control enablement of the functional circuitry 1120, such that the functional circuitry 1120 is enabled once the output voltage Vo is stable.

Figure 12:
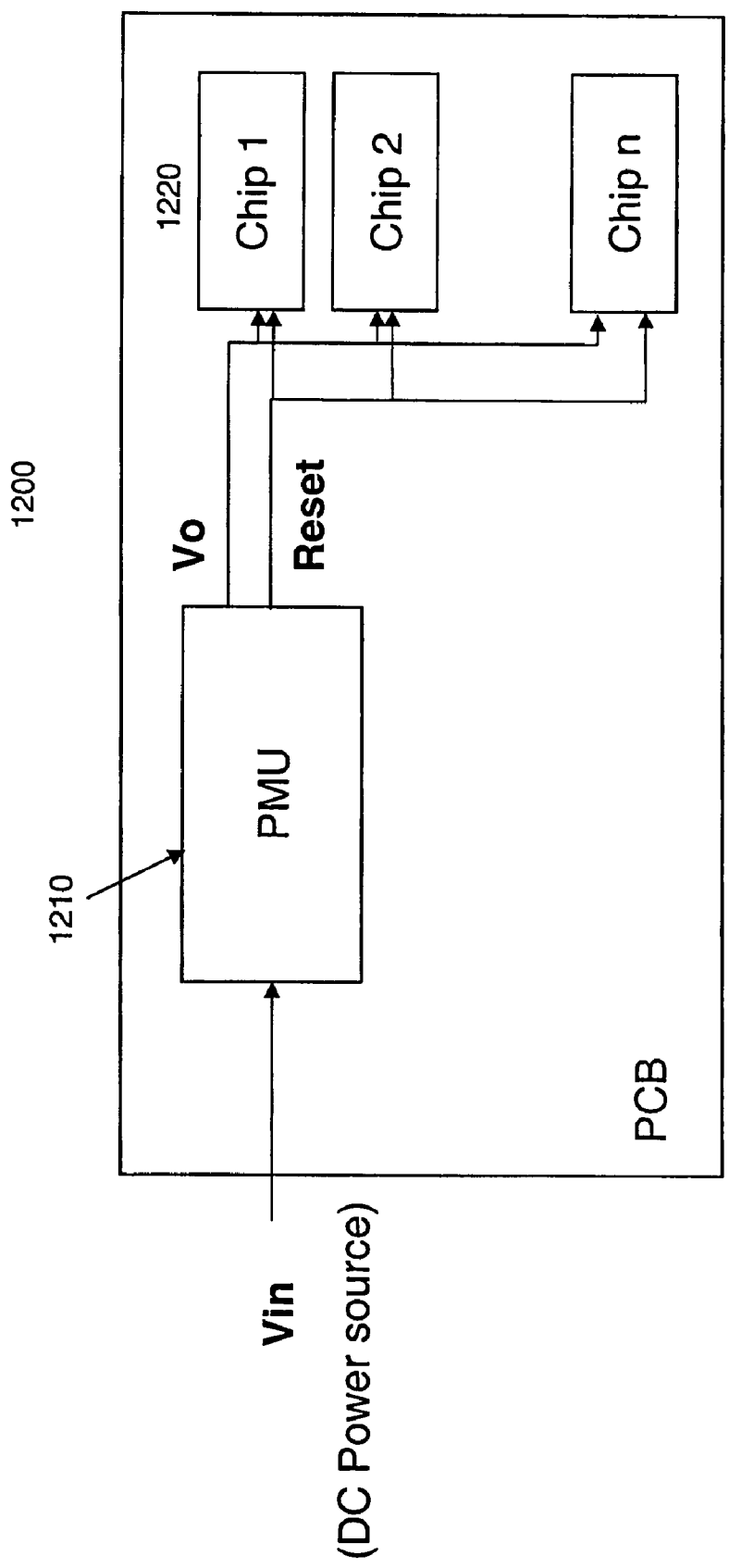
FIG. 12 illustrates a second application block diagram in accordance with an embodiment.

FIG. 12 illustrates a block diagram of an application of PMU, having a PMC, e.g., 200, 700, 900, in accordance with an embodiment. A printed circuit board (PCB) 1200 may include a PMU 1210 and a plurality of chips 1220, here, chip 1 to n. Each chip may have one or more functional circuits thereon. The PMU 1210 may be adapted to convert power from a power source Vin to the output voltage Vo and supply the output voltage Vo to the chips 1220. The PMU 1210 may also be adapted to control enablement of the chips 1220, such that the chips are enabled once the output voltage Vo is stable.

Exemplary embodiments of the present invention have been disclosed herein, and although specific terms are employed, they are used and are to be interpreted in a generic and descriptive sense only and not for purpose of limitation. For example, the processing of present invention may be implemented in software, e.g., by an article of manufacture having a machine-accessible medium including data that, when accessed by a machine, cause the machine to generate a set signal. Accordingly, it will be understood by those of ordinary skill in the art that various changes in form and details may be made without departing from the spirit and scope of the present invention as set forth in the following claims.

The invention claimed is:

1. A device, comprising:
    a first reference generator adapted to output a first reference value in response to an enable signal from an external power source;
    a second reference generator adapted to receive the first reference value and to output a second reference value;
    a switch between the first and second reference generators, the second reference generator receiving the first reference value only when the switch is turned on;

a set signal generator adapted to output a set signal when the second reference value exceeds a predetermined value;

a start-up trigger adapted to receive the enable signal and output a start-up signal to the switch; and a level shifter between the first reference generator and the start-up trigger, the level shifter configured to receive the enable signal and delay the output of the enable signal to the start-up trigger by a predetermined period of time, the predetermined period of time being different from an inherent propagation delay of the level shifter.

2. The device as claimed in claim 1, wherein the start-up trigger is connected to the first reference generator.

3. A device, comprising:

a first reference generator adapted to output a first reference value in response to an enable signal from an external power source;

a second reference generator adapted to receive the first reference value and to output a second reference value;

a set signal generator adapted to output a set signal when the second reference value exceeds a predetermined value;

a switch between the first and second reference generators;

a start-up trigger adapted to receive the enable signal and output a start-up signal to the switch;

a level shifter between the first reference generator and the start-up trigger, the level shifter configured to receive the enable signal and delay the output of the enable signal to the start-up trigger by a predetermined period of time, the predetermined period of time being different from an inherent propagation delay of the level shifter; and a power converter adapted to receive the start-up signal and to output a power in accordance with the first reference value.

4. The device as claimed in claim 3, wherein the first reference generator is integral with the power converter.

5. The device as claimed in claim 3, further comprising:

a first comparator adapted to output a difference between a magnitude of the power output by the power converter and the second reference value; and a second comparator adapted to compare the difference and the predetermined reference value, wherein the set signal generator is further adapted to output the set signal when the difference is less than another predetermined reference value.

6. A system, comprising:

a functional circuit; and a power management circuit adapted to supply power to the functional circuit, the power management circuit including a first reference generator adapted to output a first reference value in response to an enable signal from an external power source, a second reference generator adapted to receive the first reference value and to output a second reference value, a switch between the first and second reference generators, the second reference generator receiving the first reference value only when the switch is turned on, and a set signal generator adapted to output a set signal to the functional circuit when the second reference value exceeds a predetermined value, wherein the functional circuit and the power management circuit are stand alone integrated circuits;

a start-up trigger adapted to receive the enable signal and output a start-up signal to the switch;

a level shifter between the first reference generator and the start-up trigger, the level shifter configured to receive the enable signal and delay the output of the enable signal to the start-up trigger by a predetermined period of time, the predetermined period of time being different from an inherent propagation delay of the level shifter.

7. A system, comprising:

a functional circuit; and a power management circuit adapted to supply power to the functional circuit, the power management circuit including a first reference generator adapted to output a first reference value in response to an enable signal from an external power source, a second reference generator adapted to receive the first reference value and to output a second reference value, a switch between the first and second reference generators, the second reference generator receiving the first reference value only when the switch is turned on, and a set signal generator adapted to output a set signal to the functional circuit when the second reference value exceeds a predetermined value, wherein the functional circuit and the power management circuit form a system on chip;

a start-up trigger adapted to receive the enable signal and output a start-up signal to the switch;

a level shifter between the first reference generator and the start-up trigger, the level shifter configured to receive the enable signal and delay the output of the enable signal to the start-up trigger by a predetermined period of time, the predetermined period of time being different from an inherent propagation delay of the level shifter.

8. A method for generating a set signal, comprising:

generating a first reference signal in response to an enable signal from an external power source using a first reference generator;

generating a second reference signal in response to the first reference signal using a second reference generator after a predetermined period of time;

providing the first reference signal value to the second reference generator only when a switch between the first and second reference generators is turned on;

outputting the set signal when the second reference signal exceeds a predetermined reference value;

outputting a power in accordance with the first reference signal after the predetermined period of time;

determining a difference between a magnitude of the power and the second reference signal; and comparing the difference and the predetermined reference value, wherein outputting the set signal further includes outputting the set signal when the difference is less than the predetermined reference value.

9. An article of manufacture having a machine accessible medium including data that, when accessed by a machine, cause the machine to perform a method for generating a set signal, the method comprising:

receiving an enable signal from an external power source;

generating a first reference signal in response to the external enable signal using a first reference generator;

generating a second reference signal in response to the first reference signal using a second reference generator;

providing the first reference signal value to the second reference generator only when a switch between the first and second reference generators is turned on; and outputting the set signal when the second reference signal exceeds a predetermined reference value;

enabling the switch when a start-up trigger outputs a start-up signal to the switch;

providing a predetermined period of time by a level shifter between the first reference generator and the start-up trigger, the level shifter configured to receive the enable signal and delay the output of the enable signal to the start-up trigger by the predetermined period of time, the predetermined period of time being different from an inherent propagation delay of the level shifter.

10. An integrated circuit, comprising:

a power converter;

a processing unit; and a memory unit operably coupled to the processing unit, the memory including operational instructions causing the processing unit to:

generate a first reference signal using a first reference generator in response to an enable signal from an external power source;

generate a second reference signal in response to the first reference signal using a second reference generator;

provide the first reference signal value to the second reference generator only when a switch between the first and second reference generators is turned on; and when the second reference signal exceeds a predetermined value, allow the power converter to supply power from the external power source;

enable the switch when a start-up trigger outputs a start-up signal to the switch;

provide a predetermined period of time by a level shifter between the first reference generator and the start-up trigger, the level shifter configured to receive the enable signal and delay the output of the enable signal to the start-up trigger by the predetermined period of time, the predetermined period of time being different from an inherent propagation delay of the level shifter.

11. The integrated circuit as claimed in claim 10, further comprising a functional circuit adapted to receive power from the power converter.

12. The integrated circuit as claimed in claim 10, wherein the power from the power converter is supplied to an external functional circuit.

13. An integrated circuit, comprising:

a first reference generator adapted to output a first reference value in response to an enable signal from an external power source;

a second reference generator adapted to receive the first reference value and to output a second reference value;

a switch between the first and second reference generators, the second reference generator receiving the first reference value only when the switch is turned on;

a set signal generator adapted to output a set signal when the second reference value exceeds a predetermined value;

a power switch adapted to generate a supply from the external power source; and a synchronizing signal generator adapted to output a synchronizing signal to the power switch and the second reference generator.

14. An integrated circuit, comprising:

a power converter adapted to generate a supply in response to an enable signal from an external power source; and a simulator configured to simulate a stabilization period of the power converter, the simulator including a first reference generator adapted to output a first reference value in response to the enable signal, a second reference generator adapted to receive the first reference value and to output a second reference value;

a switch between the first and second reference generators, the second reference generator receiving the first reference value only when the switch is turned on, and when the second reference signal exceeds a predetermined value, the simulator allows the power converter to supply power from the external power source;

a start-up trigger adapted to receive the enable signal and output a start-up signal to the switch;

a level shifter between the first reference generator and the start-up trigger, the level shifter configured to receive the enable signal and delay the output of the enable signal to the start-up trigger by a predetermined period of time, the predetermined period of time being different from an inherent propagation delay of the level shifter.

15. A method for generating a set signal, comprising:

generating a first reference signal in response to an enable signal from an external power source;

generating a second reference signal in response to the first reference signal after a predetermined period of time;

outputting the set signal when the second reference signal exceeds a predetermined reference value;

outputting a power in accordance with the first reference signal after the predetermined period of time;

determining a difference between a magnitude of the power and the second reference signal; and comparing the difference and the predetermined reference value, wherein outputting the set signal further includes outputting the set signal when the difference is less than the predetermined reference value.

* * * * *